(12) United States Patent
Ahn et al.

(10) Patent No.: US 6,699,799 B2
(45) Date of Patent: Mar. 2, 2004

(54) METHOD OF FORMING A SEMICONDUCTOR DEVICE

(75) Inventors: Dong-Ho Ahn, Kyunggi-do (KR); Soo-Jin Hong, Seoul (KR); Jung-Il Lee, Kimcheon (KR); Kyung-won Park, Kyunggi-do (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/134,747

(22) Filed: Apr. 30, 2002

(65) Prior Publication Data

US 2002/0168873 A1 Nov. 14, 2002

(30) Foreign Application Priority Data

May 9, 2001 (KR) ........................................ 2001-25159
Aug. 30, 2001 (KR) ........................................ 2001-52926

(51) Int. Cl.[7] ............................................ H01L 21/469
(52) U.S. Cl. ...................................................... 438/781
(58) Field of Search ................................ 438/781, 780, 438/770–778

(56) References Cited

U.S. PATENT DOCUMENTS

| 5,858,869 A | * | 1/1999 | Chen et al. ................. 438/597 |
| 6,074,939 A | * | 6/2000 | Watanabe ................... 438/596 |
| 2001/0005627 A1 | * | 6/2001 | Matsubara .................. 438/637 |

FOREIGN PATENT DOCUMENTS

JP 8-306681 11/1996

* cited by examiner

*Primary Examiner*—Craig Thompson
(74) *Attorney, Agent, or Firm*—Lee & Sterba, P.C.

(57) ABSTRACT

A method of forming a semiconductor device includes a liner is conformally stacked on a semiconductor substrate before coating an SOG layer thereon, and then curing the SOG layer, preferably in an ambient of oxygen radicals formed at a temperature of 1000° C. or higher when oxygen and hydrogen are supplied. The oxygen radicals are preferably formed by irradiating ultraviolet rays to ozone or forming oxygen plasma. The SOG layer is preferably made of a polysilazane-based material that may promote a conversion of the SOG layer into a silicon oxide layer.

15 Claims, 9 Drawing Sheets

METHOD OF FORMING A SEMICONDUCTOR DEVICE

BACKGROUND OF THE INVENTION

1. Field of the Invention

The present invention relates to a method of forming a semiconductor device. More particularly, the present invention relates to a method of forming a semiconductor device used for curing a spin-on-glass (SOG) layer.

2. Description of the Related Art

As device sizes become smaller and integration density increases, patterns formed on a semiconductor substrate become increasingly narrow, while thickness of layers remains constant. For example, a shallow trench isolation (STI) process requires that a width of a device isolation layer be reduced while a depth of the device isolation layer remains unchanged, thereby causing an aspect ratio of a trench to increase. If a contact plug or a via hole is formed, a deep contact hole is formed in a narrow region. As a contact hole formed at an interlayer insulating film becomes narrower, the aspect ratio of the contact hole becomes increasingly higher. Stacking a material layer on a semiconductor substrate having a high step difference often fills a narrow space. In this case, polysilicon or tungsten layers formed by a chemical vapor deposition (CVD) technique have an excellent gap-filling property, but silicon oxide has a relatively poor gap-filling property. Thus, a layer of silicon oxide may cause problems due to the poor gap-filling property of the silicon oxide.

In order to overcome the above-mentioned gap-filling problems, various methods using ozone tetra-ethyl-ortho silicate (TEOS), undoped silicate glass (USG) or high-density plasma chemical vapor deposition (HDP-CVD) have been proposed. Unfortunately, in many cases employing these methods, even stacking oxide layers of HDP-CVD is not sufficient to fill a trench having an aspect ratio of, for example, 5. Therefore, a method using a spin-on-glass (SOG) type oxide layer has been proposed as an alternative.

Since SOG is deposited on a semiconductor substrate using a coating method and is originally liquid-phase or sol-phase, it may have an excellent gap-filling property and efficiently reduce a step difference on a semiconductor substrate. Conventionally, SOG layers have been mainly used as auxiliary layers for planarizing a semiconductor substrate and have not been regarded as suitable for forming semiconductor devices. Recently, various materials and methods for densifying a structure of an SOG layer have been studied and developed, which may contribute to the usefulness of an SOG layer as a gap-filler.

A hydro silsesquioxane (HSQ) layer will now be described as an example of an SOG layer. A liquid-phase HSQ layer is coated on a semiconductor substrate. The coated HSQ layer is subjected to a soft bake process at a temperature of from approximately 100° C. to 300° C. to eliminate a solvent, such as dialkyl ether. The soft-baked HSQ layer is subjected to a hard bake process for dozens of minutes to be hardened. Even though the hard bake process is carried out in an oxidation ambient, the HSQ layer is not fully cured. Curing occurs when an element, other than oxygen or silicon, is replaced with oxygen, thereby forming an oxidized silicon layer. Unlike an HSQ layer filling a trench having a low aspect ratio, very little of an HSQ layer formed in a narrow and deep gap having a high aspect ratio, such as between patterns on a semiconductor substrate, is changed to an oxide layer during the hard bake process.

If the HSQ layer is not fully cured, hydrogen elements remaining in the HSQ cause the HSQ layer to be porous. When the porous HSQ is subjected to an etch (particularly a wet etch) process and a cleaning process, the amount the HSQ layer is etched rises significantly. Therefore, reliability of the etching and cleaning processes performed for the exposed HSQ layer is considerably degraded. If, for example, a contact hole is being formed in the HSQ layer, the degraded etching and cleaning performance causes a bottom of the contact hole to be insufficiently cleaned to secure an adjacent HSQ layer. Thus, contact resistance is increased. On the other hand, if the bottom of the contact hole is sufficiently cleaned, an interlayer insulating film between conductors becomes thin, thereby increasing a parasitic capacitance. If a trench isolation layer is made of HSQ, the trench isolation layer is significantly recessed during processes such as cleaning. As a result, a junction leakage current and an inferior gate oxide layer occur.

Furthermore, because the HSQ layer contracts considerably during a bake process or other similar process, and because a degree of curing is not uniform throughout the HSQ layer, a stress difference occurs from thermal extension. As a result of this stress difference, the likelihood of developing defects such as cracks in the HSQ layer rises, and device reliability deteriorates.

SUMMARY OF THE INVENTION

A feature of an embodiment of the present invention provides a method of forming a semiconductor device that may easily fill an insulating layer on a semiconductor substrate having a high aspect ratio.

Another feature of an embodiment of the present invention provides a method of forming a semiconductor device that may prevent a layer damaged in a wet etch process from having an adverse effect on device characteristics during formation of a silicon oxide layer on a semiconductor substrate using an SOG technique.

Still another feature of an embodiment of the present invention provides a method of forming a semiconductor device that may easily cure an SOG layer into a silicon oxide layer.

A method according to an embodiment of the present invention may be generally summarized as conformally stacking a liner on a semiconductor substrate having at least one concave region, coating a spin-on-glass (SOG) layer on the liner to fill the at least one concave region, and curing the SOG layer.

According to an embodiment of the present invention, curing of the SOG layer may be performed in a high-temperature vapor ambient of from approximately 700° C. to 1000° C. Preferably, the curing is performed in a processing space where oxygen or oxygen radicals exist. As a method for forming these oxygen radicals, a method of irradiating ultraviolet light in an ozone ambient, a method of forming and applying oxygen plasma, and a method of introducing oxygen and hydrogen at a high temperature of 1000° C. may be used. In the event that oxygen and hydrogen are provided at a high temperature, they react with each other to make a high temperature water vapor ambient and enable the oxygen radicals to promote the SOG curing.

The liner may include silicon, silicon nitride or a combination thereof. Here, silicon may include polysilicon, amorphous silicon, conductive impurity doped silicon, germanium doped silicon, or pure silicon. An oxygen barrier layer, such as a silicon nitride layer, may be stacked to form a combination layer before stacking the silicon layer in order to prevent diffusion of oxygen into a lower structure during a high-temperature curing process. During the curing process, the liner is oxidized to be an oxygen flow passage, which helps cure an SOG layer in a deep gap.

The SOG layer may be formed of a conventional HSQ layer. Preferably, the SOG layer is made of a polysilazane-based material that is suitable for a high-temperature curing process and that has an enhanced degree of transformation into an oxide layer. After coating the SOG layer, a chemical mechanical polishing (CMP) process may be performed before or after the curing process. A wet process, such as a wet etch or a cleaning process, is preferably performed after stacking and curing the SOG layer.

These and other features and advantages of the present invention will be readily apparent to those of ordinary skill in the art upon review of the detailed description that follows.

DETAILED DESCRIPTION OF THE INVENTION

Korean Patent Application No. 2001-25159, filed on May 9, 2001, and entitled: "Method of Forming Semiconductor Device," and Korean Patent Application No. 2001-52926, filed on Aug. 30, 2001, and entitled: "Method of Forming Semiconductor Device," are incorporated by reference herein in their entirety.

The present invention will be described more fully hereinafter with reference to the accompanying drawings. It should be understood that when a layer or region is referred to as being "on" another layer, region, or substrate, it may be directly on the other layer, region, or substrate, or intervening layers or regions may also be present. Conversely, when a layer or region is indicated as being "directly on" another layer, region, or substrate, intervening layers or regions are not present.

[First Embodiment]

Several processing steps of a first embodiment of the present invention are illustrated in FIG. 1 through FIG. 4.

Figure 1:
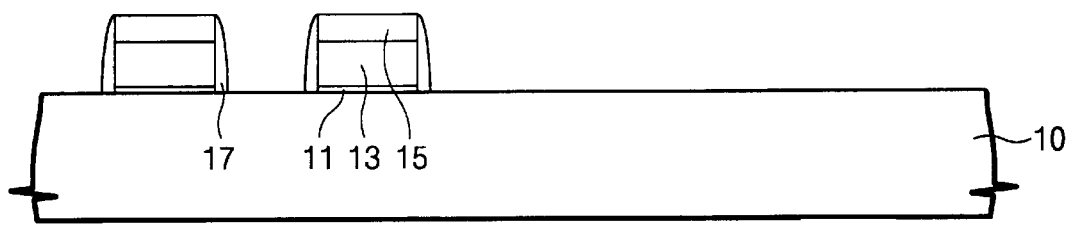
FIG. 1 through FIG. 4 illustrate cross-sectional flow diagrams showing several processing steps of a first embodiment of the present invention.

Referring now to FIG. 1, a gate electrode pattern is formed on a semiconductor substrate 10. Conventionally, a well is formed and device isolation is accomplished at the substrate 10 before forming the gate electrode pattern. A gate insulating layer is formed at an active region of the substrate 10. A conductive layer for the gate insulating layer is stacked thereon. A silicon nitride layer, acting as a capping layer, may be stacked on the conductive layer. The capping layer, the conductive layer, and the gate insulating layer are patterned by photolithographic and etching processes, forming a gate electrode pattern including a gate insulating layer pattern 11, a gate electrode 13, and a capping layer pattern 15. An annealing process is performed in order to cure etch damage in the patterning process, and then, a silicon nitride layer is stacked and anisotropically etched to form an insulating spacer 17 on both sidewalls of the gate electrode.

Figure 2:
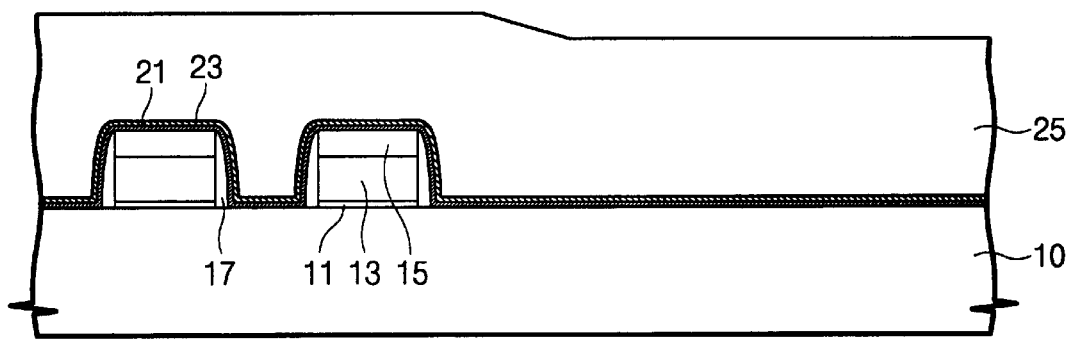

Referring now to FIG. 2, a silicon nitride layer 21 is thinly formed on an entire surface of the substrate 10. The silicon nitride layer 21 acts as an etch-stop layer in a subsequent process for forming a contact hole, and as an oxygen barrier layer in a high-temperature curing process for the SOG layer. A silicon layer 23 is stacked on the silicon nitride layer 21 by chemical vapor deposition (CVD). A polysilicon layer or an amorphous silicon layer may be stacked thereon according to stacking temperature and pressure. Stacking thickness may be selected according to a size and an aspect ratio of a gap formed between gate electrode patterns. A silicon layer having a thickness of from approximately 50 Å to 300 Å is preferable and efficient for the present invention.

An SOG layer 25 is coated on a resultant structure where the silicon layer 23 is formed. Among the latest materials used for making an SOG layer is a silazane-based material having a molecular weight of from 1000 to 10,000, which is represented as "—($SiR_1R_2NR_3$)n—". The silazane-based material is, for example, organic polysilazane that comprises an organic atomic group such as perhydro polysilazane wherein $R_1$, $R_2$, and $R_3$ are all hydrogen, an alkyl group wherein each of $R_1$, $R_2$, and $R_3$ is 1–8 carbon, an aryl group, an alkoxy group, or the like. The polysilazane used in a coating process is contained in an organic solvent such as dibutyl ether, toluene, xylene, or the like with a constant percent by weight. The SOG-coating material, so-called polysilazane, may be annealed at a higher temperature than a siloxane-based material containing silicate or silsesquioxane. Therefore, improved curing is accomplished to enhance resistance against a wet etch. Furthermore, the polysilazane is more easily applied than HSQ in various processes.

A thickness of the SOG layer 25 may be controlled according to a percent by weight of solid contained in a polysilazane solution and a speed of a spinner used in the coating process. For example, if a coating process is performed using a solution containing a polysilazane solid of 20% in a dibutyl ether solvent under the condition that a spinner speed is hundreds to thousands of revolutions per minute (rpm), the SOG layer 25 may have a sufficient thickness of approximately 5000 Å.

Figure 3:
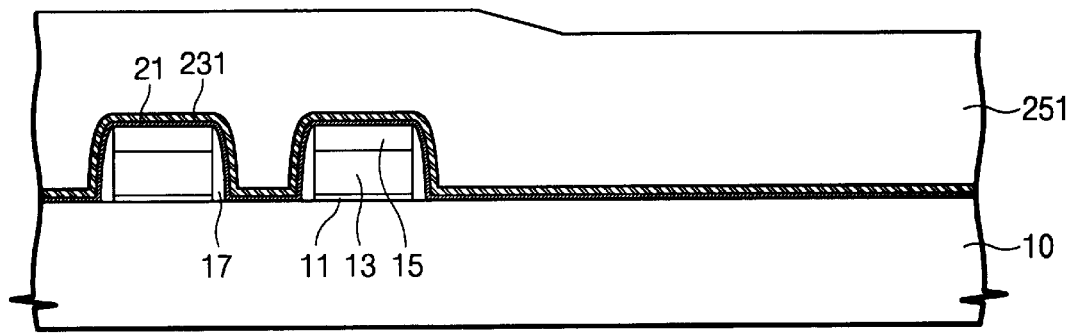

Referring now to FIG. 3, when polysilazane is coated, a bake process is performed to remove a solvent component. The bake process may include a pre-bake process performed at a temperature of from approximately 80° C. to 350° C., a hard bake process performed at a temperature of approximately 400° C., or a combination process thereof. Through this procedure, a solvent component and a component containing silane gas, nitrogen, and hydrogen may be discharged in gas phase from an SOG layer 251.

An annealing process is performed at a high temperature of from approximately 700° C. to 1000° C. for 10–60 minutes, discharging other components from SOG layer 251. Then, a curing process is performed in a vapor-supply oxidation ambient to eliminate components except organic components or silicon; oxygen is supplied to form a silicon oxide layer.

During the high-temperature annealing process, a silicon layer (23 of FIG. 2) under the SOG layer 251 is converted into a silicon oxide layer 231 by diffused oxygen. A surface of the silicon nitride layer 21 is also converted into the silicon oxide layer 231. A volume of the silicon layer converted into the silicon oxide layer 231 is extended to apply a pressure to an adjacent SOG layer 251. After coating the SOG layer 251, the SOG layer 251 is cured to shrink the volume thereof by approximately 20%. Due to the pressure, a chemical reaction of the SOG layer 251 is activated toward a volume shrinkage, i.e., formation of a silicon oxide layer by the curing. For that reason, the curing is promoted at an SOG layer 251 adjacent to the silicon oxide layer 231 formed by oxidizing the silicon layer (23 of FIG. 2).

In a deep portion of a gap between gate electrode patterns, oxygen diffuses through the SOG layer 251. Additionally, oxygen diffuses through a silicon oxide layer 231 coupled with an upper portion of the gap. Therefore, in the deep portion of the gap, oxygen diffuses from the silicon oxide layer 231 to the SOG layer 251 between the SOG layer 251 and the silicon oxide layer 231. Accordingly, curing of the SOG layer 251 is improved around the silicon oxide layer 231.

As a result, in a deep portion of a gap between gate electrode patterns, particularly a lower edge portion (i.e., poor curing portion) of the gap, the SOG layer 251 receives pressure and air flow from the silicon oxide layer 231 formed by oxidizing an underlying silicon layer to achieve better curing than without the silicon oxide layer 231. Therefore, a difference in a degree of curing between an upper portion and a lower portion of the SOG layer 251 is reduced. Also, a curing difference between a cell region having a narrow gap and gap-free core/peripheral circuit regions is reduced. Since an SOG layer 251 is not readily etched at a sufficiently cured location during a wet process, the wet process may easily be performed in a subsequent process following formation of the SOG layer 251.

Figure 4:
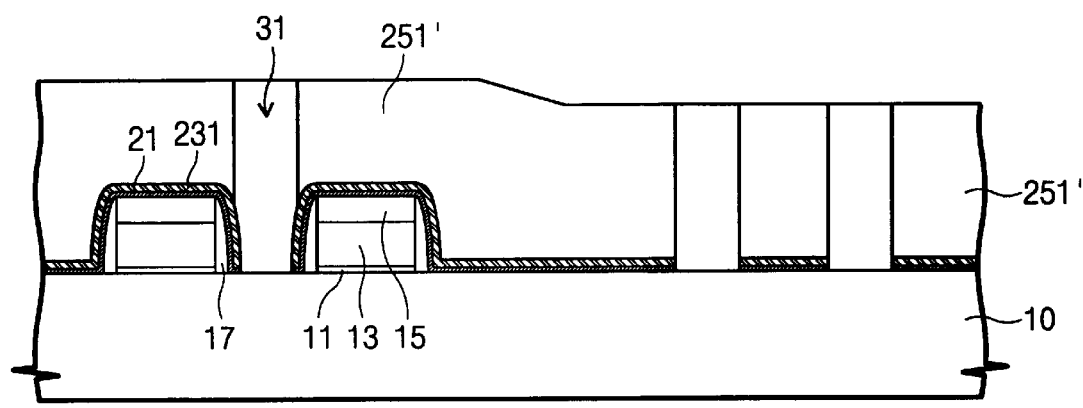

Referring now to FIG. 4, an SOG layer 251' is patterned to form a contact hole 31. In the patterning, a dry etch is carried out by anisotropically etching the SOG layer 251', a silicon oxide layer 231, and a silicon nitride layer 21, which acts as an etch-stop layer.

In order to lower a contact resistance after forming the contact hole 31, an oxide layer and impurities are removed from a surface of a semiconductor substrate 10 that is exposed at a bottom of the contact hole 31. In this case, the impurities are removed using a wet etch or a cleaning process. During the wet etch, both upper and lower portions of the SOG layer 251' are sufficiently cured to suppress over-extension of a contact hole bottom or prevent the SOG layer 251' from becoming thin when the SOG layer 251' is wholly etched.

[Second Embodiment]

Figure 5:
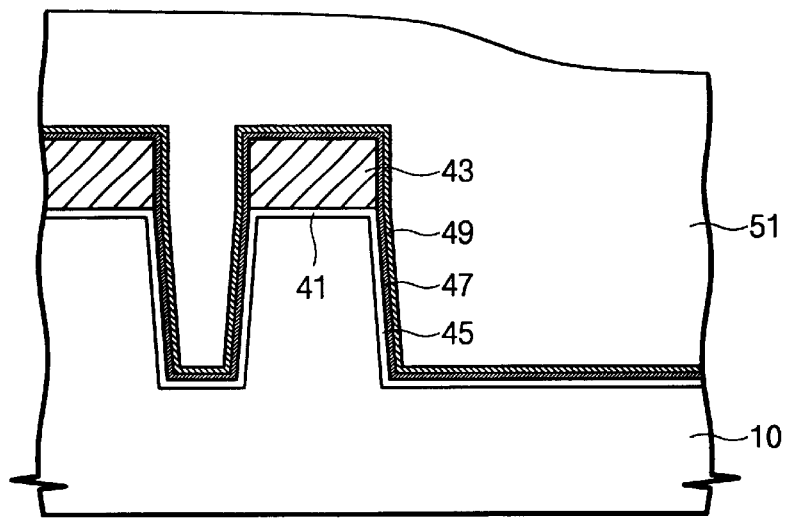
FIG. 5 through FIG. 7 illustrate cross-sectional flow diagrams showing several processing steps of a second embodiment of the present invention.
Figure 6:
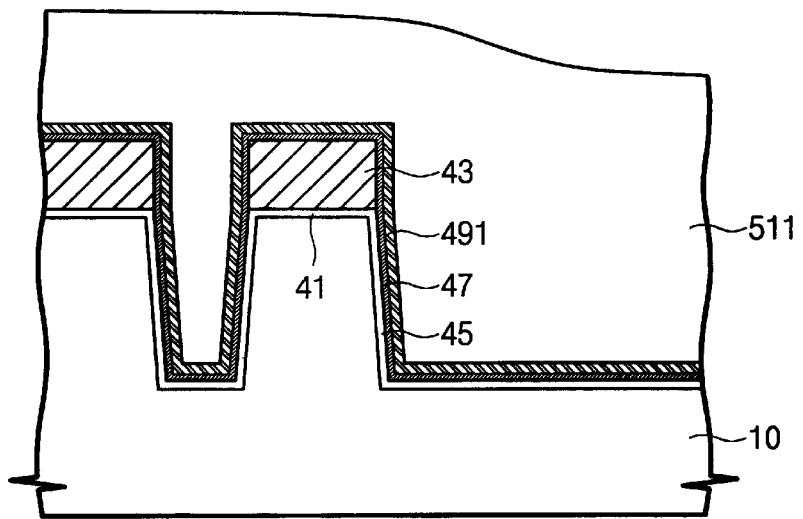
Figure 7:
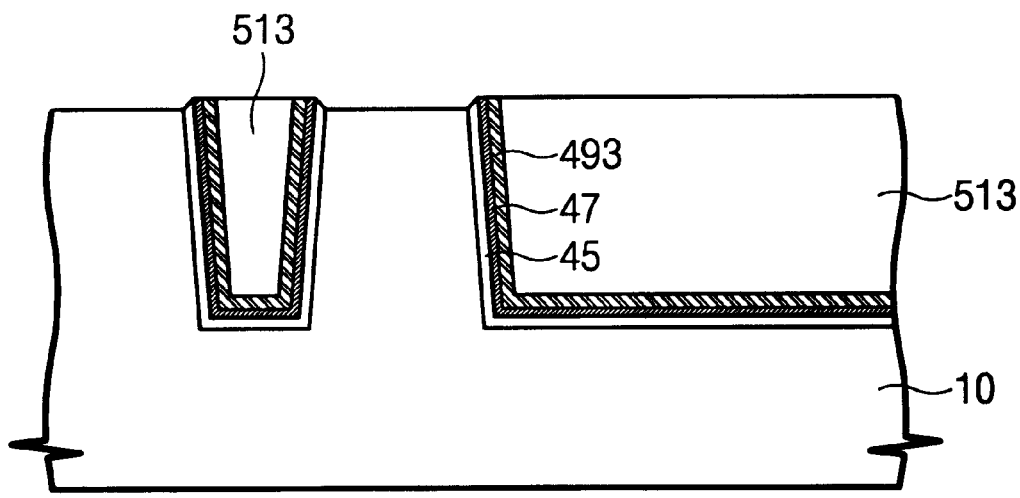

Several processing steps of a second embodiment of the present invention are illustrated in FIG. 5 through FIG. 7.

Referring now to FIG. 5, a trench for device isolation is formed on a semiconductor substrate 10. A thin thermal oxide layer 45 is formed at the trench. A silicon nitride liner 47 and a silicon layer 49 are sequentially stacked on the oxide layer 45 using a chemical vapor deposition (CVD) technique. An SOG layer 51 is coated on the silicon layer 49. The trench is formed by sequentially forming and patterning a pad oxide layer 41 and an etch-stop layer made of silicon nitride on the substrate 10, and then etching the substrate 10 using an etch-stop layer pattern 43 as an etch mask. The silicon nitride liner 47 is formed by the CVD technique to act as an oxygen barrier. A surface of the silicon nitride liner 47 may be oxidized to allow the silicon nitride liner 47 to be an oxygen flow passage in a subsequent process. The silicon layer 49 is formed to a thickness of from approximately 50 Å to 300 Å, and the SOG layer 51 is formed sufficiently to fill the trench. For example, with the use of the same polysilazane-based material as in the first embodiment, particularly perhydro polysilazane wherein all organic groups "R" are exchanged with hydrogen, a solid composition ratio is controlled to fill the trench with the SOG layer 51 that is stacked on the etch-stop layer pattern 43 acting as an etch mask, to a thickness of hundreds of angstroms.

Referring now to FIG. 5 and FIG. 6, a bake process and a curing process are sequentially performed after coating the SOG layer 51. The curing process is performed in a wet ambient with vapor at a temperature of from approximately 800° C. to 900° C. for 10–60 minutes. Therefore, the silicon layer 49 and the SOG layer 51 stacked on the etch-stop layer pattern 43 are converted into a silicon oxide layer 491 and a cured SOG layer 511, respectively, similar to the first embodiment. In this case, a chemical reaction is identical to that of the first embodiment.

Referring now to FIG. 6 and FIG. 7, layers stacked on the etch-stop layer pattern 43 are subjected to a chemical mechanical polishing (CMP) process, planarizing the silicon oxide layer 491 and the cured SOG layer 511 to be removed partially, leaving silicon oxide layer 493 and cured SOG layer 513, and exposing a top surface of the etch-stop layer pattern 43. The CMP process may be performed before a curing process.

The etch-stop layer pattern 43 is removed using a phosphoric wet etch technique. The pad oxide layer 41 and impurities are cleaned by a deep method using an LAL solution containing fluoric acid and ammonium hydroxide and having an etch selectivity with regard to the thermal oxide layer 45. Since the SOG layer 513 is cured sufficiently, a recess of the device isolation layer 45 is not great and is similar to that of the remaining silicon oxide layer 493. Therefore, it is possible to prevent over-recess from causing deterioration of device characteristics associated with junction depth of an adjacent transistor device and a gate insulating layer.

Figure 8A:
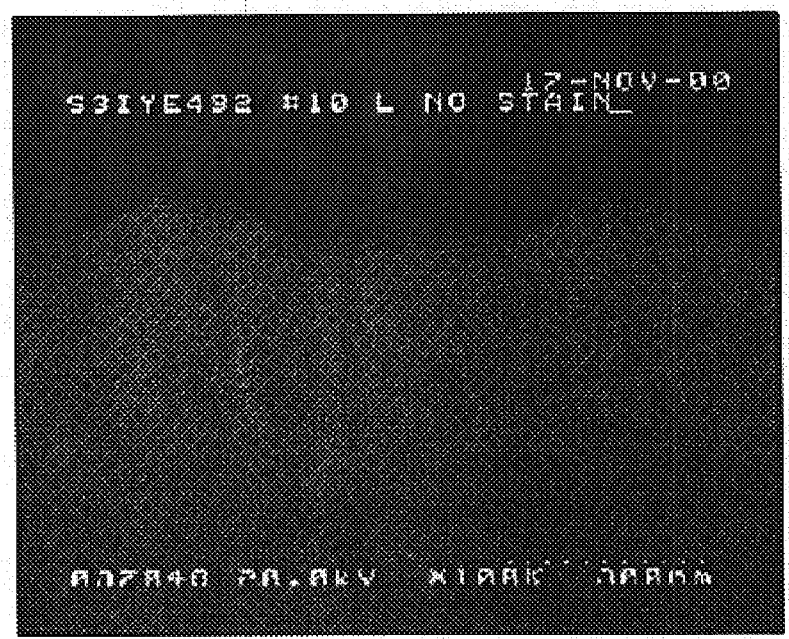
FIG. 8A through FIG. 10B are photographs taken under a scanning electron microscope (SEM), showing an SOG layer removed in a narrow pattern spaced region and a wide pattern spaced region based on time required for a wet processing to the SOG layer according to an embodiment of the present invention.
Figure 8B:
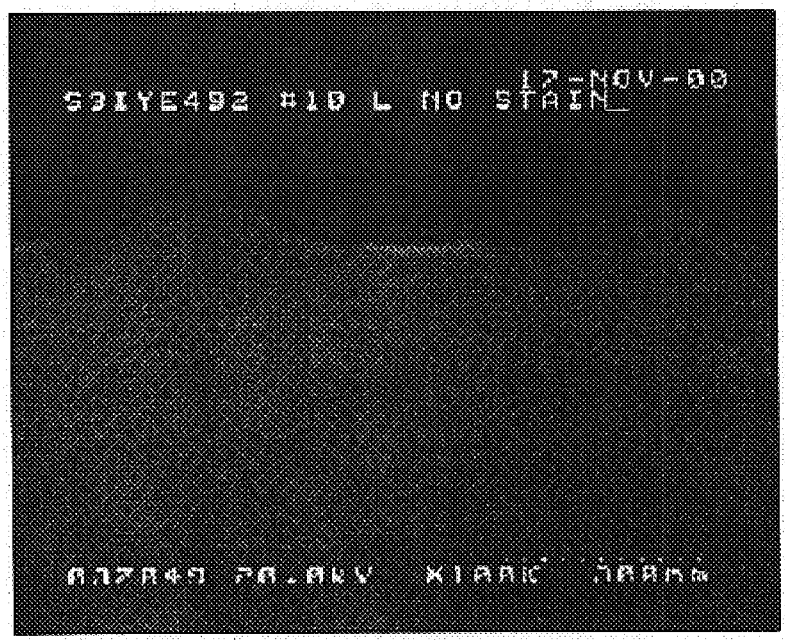
Figure 9A:
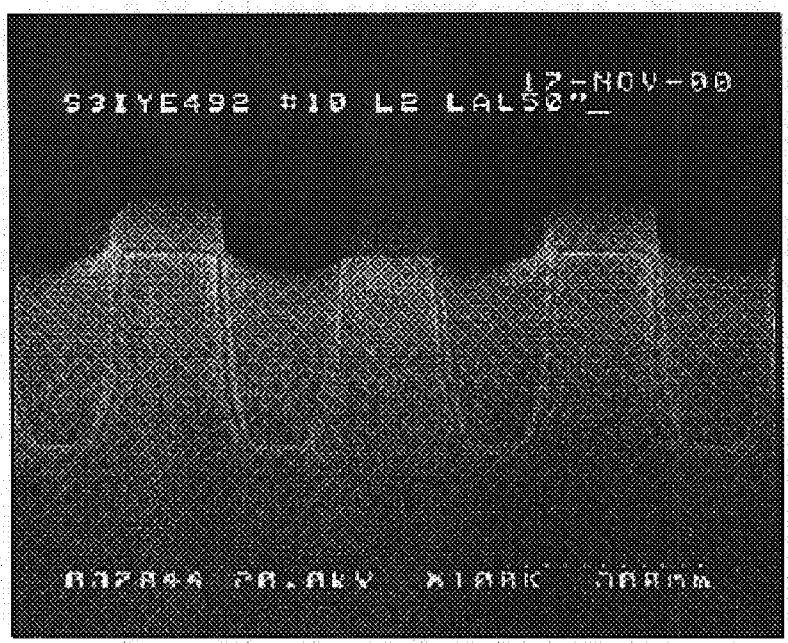
Figure 9B:
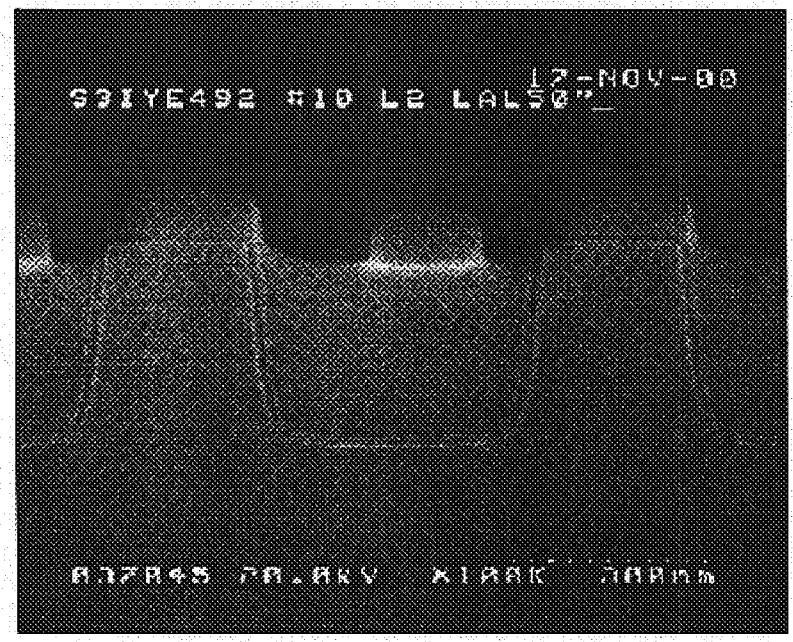
Figure 10A:
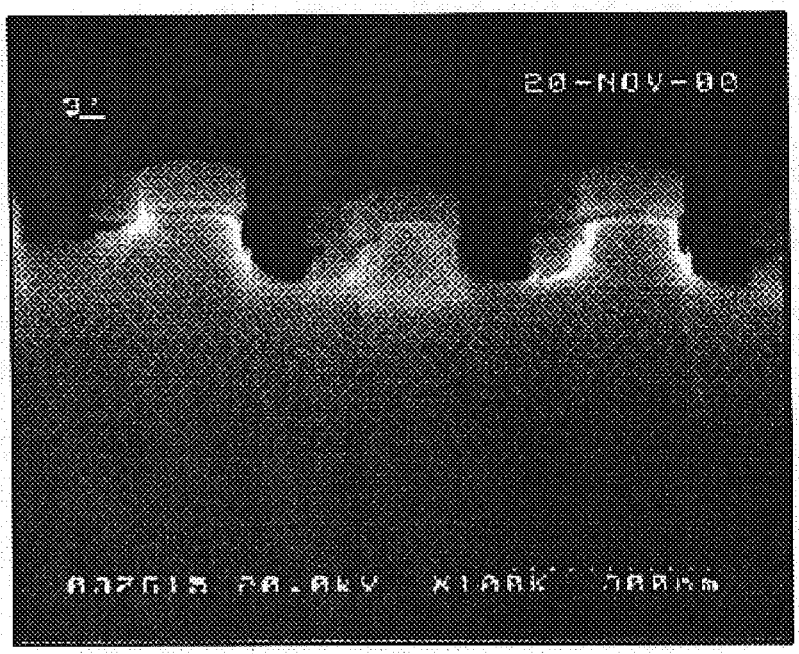
Figure 10B:
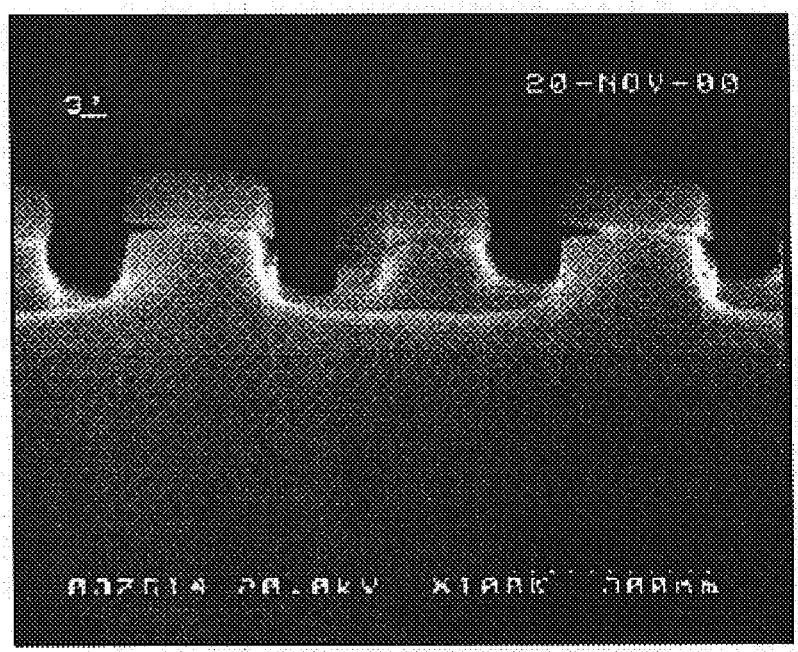

FIG. 8A, FIG. 9A, and FIG. 10A illustrate an etch state of a device isolation layer in a narrow pattern spaced region with a semiconductor substrate processed by LAL solution. Alternatively, FIG. 8B, FIG. 9B, and FIG. 10B illustrate an etch state of a device isolation layer in a wide pattern spaced region with the semiconductor substrate processed by LAL solution. Particularly, FIG. 8A and FIG. 8B show a result immediately following the etch, FIG. 9A and FIG. 9B show a result 50 seconds after the etch, and FIG. 10A and FIG. 10B show a result three minutes after the etch.

[Third Embodiment]

Figure 11:
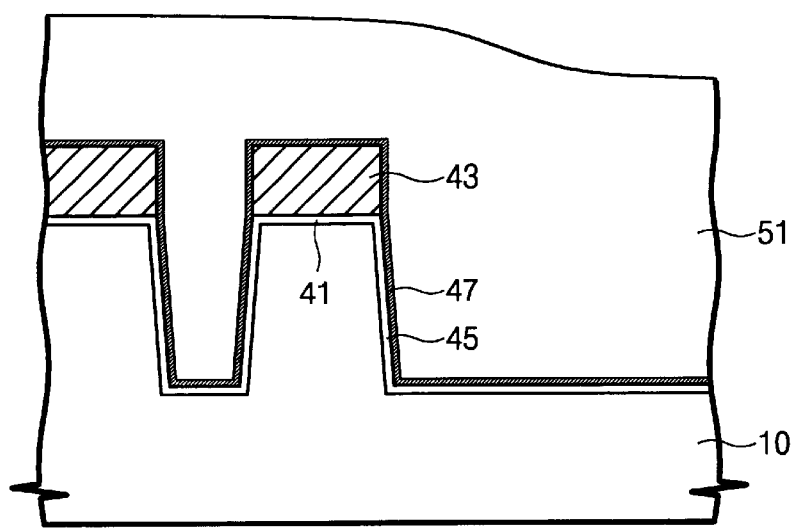
FIG. 11 through FIG. 13 are cross-sectional flow diagrams showing several processing steps of a third embodiment of the present invention.
Figure 12:
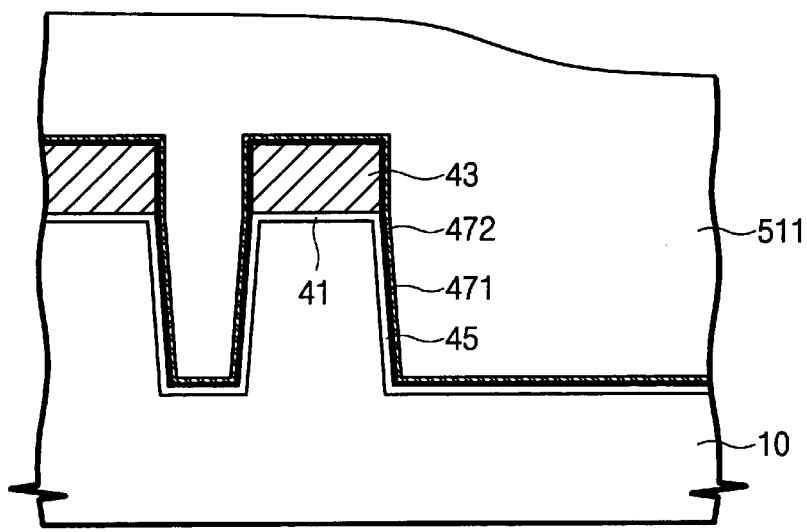
Figure 13:
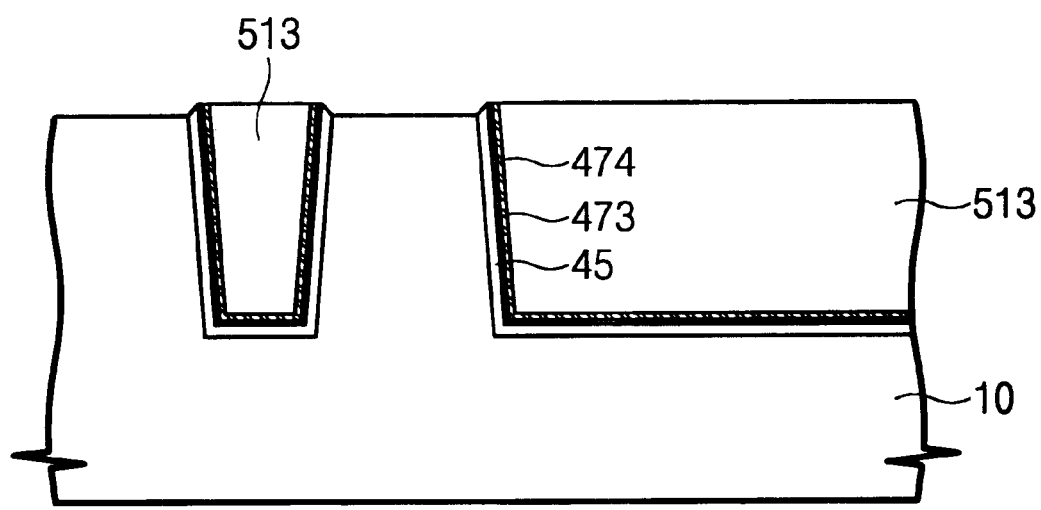

Several processing steps of a third embodiment of the present invention are illustrated in FIG. 11 through FIG. 13.

Referring now to FIG. 11, a trench for device isolation is formed in a semiconductor substrate 10. A thin thermal oxide layer 45 is formed at the trench, and then a silicon nitride liner 47 is stacked thereon using a CVD technique. An SOG layer 51 is coated on the silicon nitride liner 47.

A method of forming the trench and the silicon nitride liner 47 is similar to that in the second embodiment, i.e., the trench is formed by sequentially forming and patterning a pad oxide layer 41 and an etch-stop layer made of silicon nitride on the substrate 10, and then etching the substrate 10 using an etch-stop layer pattern 43 as an etch mask. However, a difference exists between the second and third embodiments. That is, a silicon layer is oxidized to be an oxygen flow passage in the second embodiment, while a surface of an oxidized silicon nitride layer is oxidized to be an oxygen flow passage in the third embodiment. Furthermore, a lower portion of a non-oxidized silicon nitride layer acts as an oxygen diffusion barrier layer in the third embodiment.

The SOG layer 51 is stacked sufficiently to fill the trench. The remaining disclosure associated with the SOG layer 51 is the same as set forth in connection with the first and second embodiments.

Referring now to FIG. 11 and FIG. 12, after coating an SOG layer 51, baking and curing processes are sequentially performed. The curing process is performed in an oxygen radical ambient. To form oxygen radicals, it is preferable that ozone gas is supplied to a process chamber and ozone is exposed to ultraviolet rays to discharge nascent oxygen. Alternatively, oxygen or oxygen-containing gas such as ozone may be supplied into the process chamber and a high-frequency field may be applied to produce plasma containing the oxygen radicals, as in an ashing process. In order to alleviate a shocking force of plasma particles toward a semiconductor substrate, remote plasma is used where a main plasma space is formed apart from a surface of the semiconductor substrate.

If an annealing process is performed by heating an interior of a rapid thermal processing (RTP) apparatus over 1000° C. and supplying oxygen and hydrogen to the RTP apparatus, an SOG layer is cured in a high-temperature vapor ambient and oxygen radicals are partially formed. Thus, oxidizing the SOG layer and a surface of an underlying silicon nitride liner 47 converts a surface of the silicon nitride liner formed on an inner wall of the trench and an overlying SOG layer 51 into a silicon oxide layer 472 and a cured SOG layer 511, respectively. In this case, reference numeral 471 represents a silicon nitride liner after oxidizing.

Referring now to FIG. 12 and FIG. 13, layers stacked on the etch-stop layer pattern 43 are subjected to a CMP process. Thus, the silicon oxide layer 472 and the cured SOG layer 511 are partially removed, and the silicon nitride liner 471 or a top surface of the etch-stop layer pattern 43 is exposed.

The etch-stop layer pattern 43 is removed in a subsequent wet etch process. The pad oxide layer 41 and other impurities are removed in a cleaning process. Since the SOG layer 513 is cured sufficiently, a recess of the device isolation layer is not great and is similar to that of a remaining silicon oxide layer 474 formed by oxidizing a liner. Therefore, it is possible to prevent an over-recess from causing deterioration of transistor characteristics. Reference character 473 represents a remaining silicon nitride liner.

According to the present invention, when an SOG layer fills a gap between patterns of a high-density semiconductor device having a high aspect ratio, the SOG layer is cured and thereby converted into a silicon oxide layer. As a result, a curing difference between upper and lower portions of a gap, and narrow and wide portions of a gap may be decreased. Thus, curing is improved to prevent a rapidly etched surface of the SOG layer from having an adverse effect on a semiconductor device even though a subsequent wet cleaning or etch process is performed.

Having now fully described the present invention, it will be appreciated by those of ordinary skill in the art that the present invention may be performed within a wide range of equivalent parameters, concentrations and conditions, without departing from the spirit and scope of the present invention and without undue experimentation. While this invention has been described in connection with specific and preferred embodiments thereof, it will be understood that the present invention is capable of further modifications. The scope of this disclosure is intended to cover any variations, uses, or adaptations of the present invention following, in general, the principles of the present invention, and including such departures from the present disclosure as come within known or customary practice within the art to which the present invention pertains, and as may be applied to the essential features hereinbefore set forth as follows in the scope of the appended claims.

What is claimed is:

1. A method of forming a semiconductor device, comprising:

conformally stacking a non-oxidized silicon layer as a liner on a semiconductor substrate having at least one concave region;

coating a spin-on-glass (SOG) layer on the liner to fill the concave region; and curing the SOG layer.

2. The method as claimed in claim 1, wherein the SOG layer is made of a silazane-based material.

3. The method as claimed in claim 2, wherein the SOG layer is made of an organic polysilazane-based material.

4. The method as claimed in claim 3, wherein the SOG layer is made of a perhydro polysilazane.

5. The method as claimed in claim 1, wherein the non-oxidized silicon layer is made of a material selected from the group consisting of polysilicon and amorphous silicon and is formed to a thickness of from approximately 50 Å to 300 Å.

6. The method as claimed in claim 1, further comprising conformally forming an oxygen barrier layer on the semiconductor substrate having the at least one concave region prior to forming the non-oxidized silicon layer.

7. The method as claimed in claim 1, wherein the at least one concave region is a trench for device isolation.

8. The method as claimed in claim 1, further comprising planarizing the SOG layer using a chemical mechanical polishing (CMP) technique before or after curing the SOG layer.

9. The method as claimed in claim 10, further comprising performing a wet etch process using an etch recipe for etching a silicon oxide layer after planarizing the SOG layer.

10. The method as claimed in claim 1, wherein the curing is performed in a vapor ambient of from 700° C. to 1000° C.

11. The method as claimed in claim 1, wherein the curing is performed in an oxygen radical ambient.

12. The method as claimed in claim 11, wherein ozone is supplied to a space where the SOG layer is cured and infrared rays are irradiated to the space where the SOG layer is cured in order to form oxygen radicals.

13. The method as claimed in claim 11, wherein gas containing oxygen is supplied to a space where the SOG layer is cured and a high frequency field is formed to be plasma-phase in order to form the oxygen radicals.

14. The method as claimed in claim 11, wherein a space where the SOG layer is cured is heated to a temperature of 1000° C. or higher and oxygen and hydrogen are supplied thereto in order to form the oxygen radicals.

15. The method as claimed in claim 1, wherein the liner is selected from the group consisting of a silicon nitride layer and a dual-structured layer of a silicon nitride layer and a silicon layer.

* * * * *